(12) United States Patent
Pradhan et al.

(10) Patent No.: US 10,854,740 B2
(45) Date of Patent: Dec. 1, 2020

(54) PHASE MODULATORS BASED ON AMBIPOLAR FIELD-EFFECT TRANSISTORS

(71) Applicant: FLORIDA STATE UNIVERSITY RESEARCH FOUNDATION, INC., Tallahassee, FL (US)

(72) Inventors: Nihar R. Pradhan, Tallahassee, FL (US); Stephen A. Mcgill, Tallahassee, FL (US)

(73) Assignee: FLORIDA STATE UNIVERSITY RESEARCH FOUNDATION, INC., Tallahassee, FL (US)

( * ) Notice: Subject to any disclaimer, the term of this patent is extended or adjusted under 35 U.S.C. 154(b) by 0 days.

(21) Appl. No.: 16/449,597

(22) Filed: Jun. 24, 2019

(65) Prior Publication Data

US 2020/0111900 A1    Apr. 9, 2020

Related U.S. Application Data

(60) Provisional application No. 62/741,020, filed on Oct. 4, 2018.

(51) Int. Cl.
*H01L 29/06* (2006.01)
*H01L 29/76* (2006.01)
(Continued)

(52) U.S. Cl.
CPC ...... *H01L 29/7606* (2013.01); *H01L 21/0262* (2013.01); *H01L 21/02568* (2013.01);
(Continued)

(58) Field of Classification Search
CPC .......... H01L 21/02568; H01L 21/0262; H01L 21/02631; H01L 21/02694; H01L 21/477;
(Continued)

(56) References Cited

U.S. PATENT DOCUMENTS

| 2005/0089257 | A1* | 4/2005 | Barrios | G02F 1/025 385/2 |
| 2011/0127488 | A1* | 6/2011 | Brown | B82Y 10/00 257/9 |
| 2017/0221596 | A1* | 8/2017 | Caldwell | G01J 5/0896 |

OTHER PUBLICATIONS

Hart et al.: "Electronic Bandstructure and Van Der Waals Coupling of ReSe2 Revealed by High-Resolution Angle-Resolved Photoemission Spectroscopy", Scientific Reports, Jul. 11, 2017, 7:5145, pp. 1-9.

(Continued)

*Primary Examiner* — Brook Kebede
(74) *Attorney, Agent, or Firm* — Fox Rothschild LLP

(57) ABSTRACT

Systems and methods for providing a phase modulator. The methods comprise creating a Field Effect Transistor (FET) by: placing a crystal structure displaying ambipolarity on a substrate comprising an oxide layer and a conductive silicon layer, the conductive silicon layer providing a gating electrical contact for the phase modulator, and forming source and drain electrical contacts on the crystal structure using e-beam lithography and an e-beam evaporator. The methods also comprising: annealing the FET to improve an interface between the crystal structure and the source and drain electrical contacts; and coating the FET with a dielectric layer to reduce or eliminate hysteresis so that a functionality of the phase modulator is improved.

22 Claims, 13 Drawing Sheets

(51) Int. Cl.
  *H01L 21/02*   (2006.01)
  *H01L 29/24*   (2006.01)
  *H01L 21/477*  (2006.01)
  *H01L 29/66*   (2006.01)

(52) U.S. Cl.
  CPC .. *H01L 21/02631* (2013.01); *H01L 21/02694* (2013.01); *H01L 21/477* (2013.01); *H01L 29/24* (2013.01); *H01L 29/66969* (2013.01)

(58) Field of Classification Search
  CPC .............. H01L 29/24; H01L 29/66969; H01L 29/7606
  USPC ......................................................... 257/29
  See application file for complete search history.

(56) References Cited

OTHER PUBLICATIONS

McCreary et al.: "Intricate Resonant Raman Response in Anisotropic ReS2", American Chemical Society: Nano Letters, Aug. 18, 2017, 17, pp. 5897-5907.

* cited by examiner

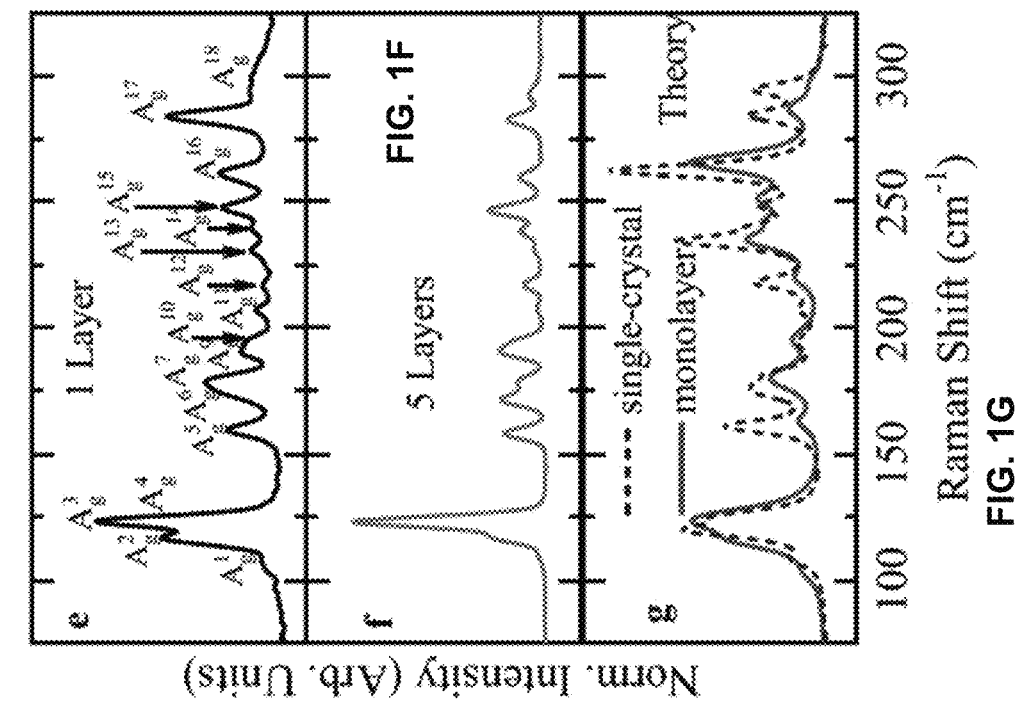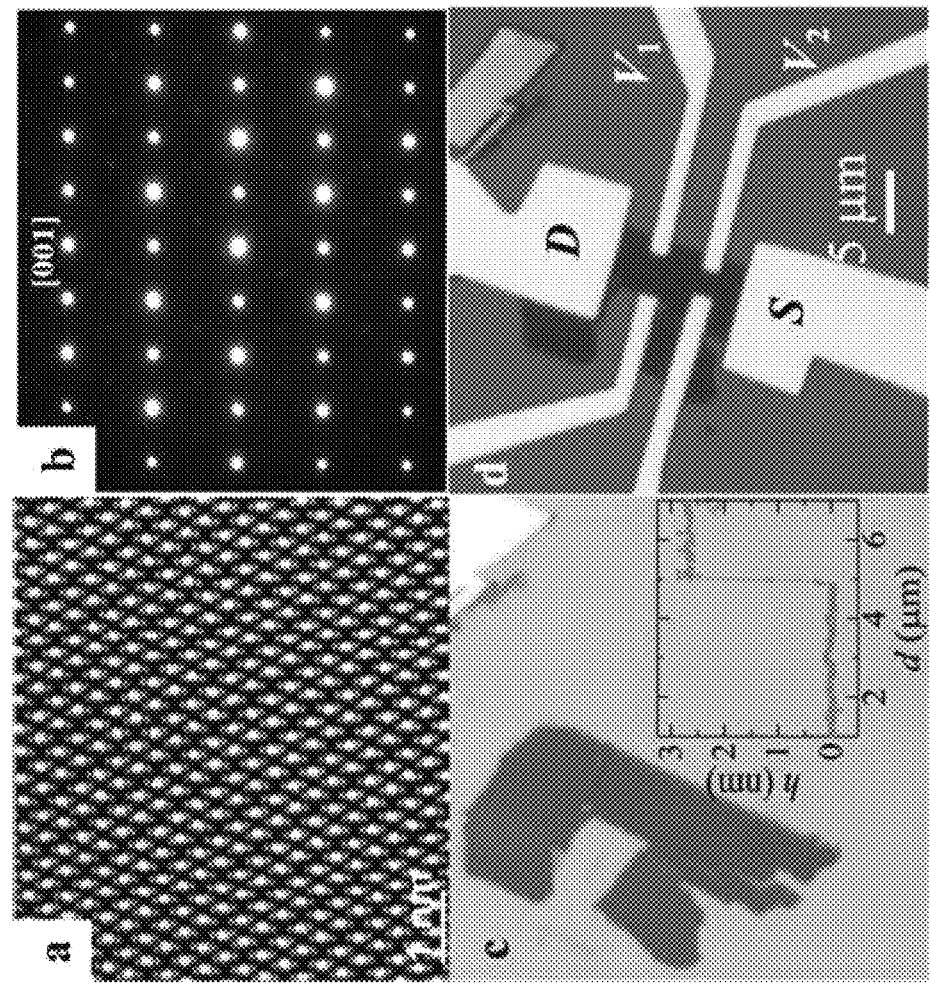

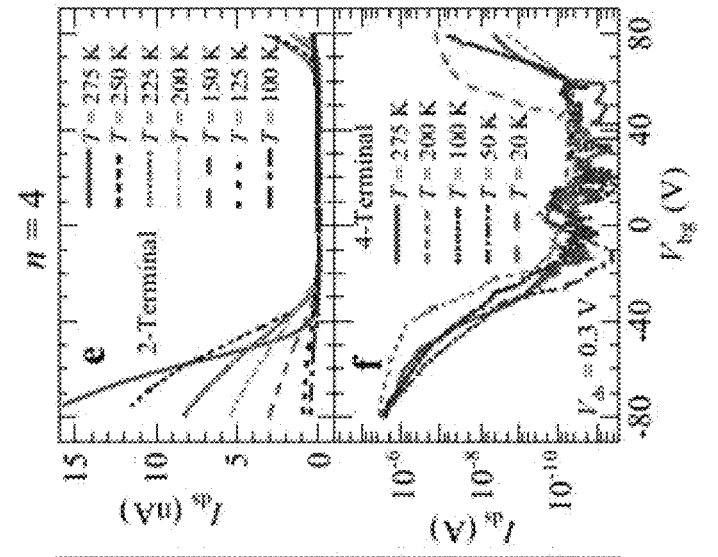
FIG. 2E  FIG. 2C  FIG. 2A
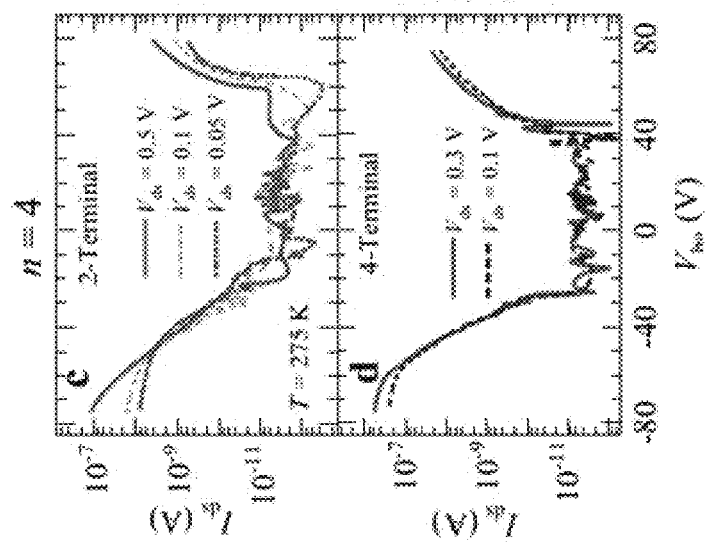
FIG. 2F  FIG. 2D  FIG. 2B
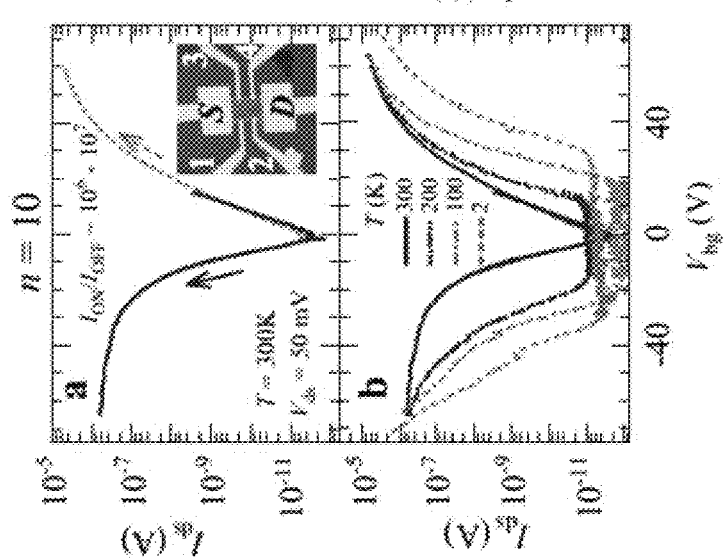

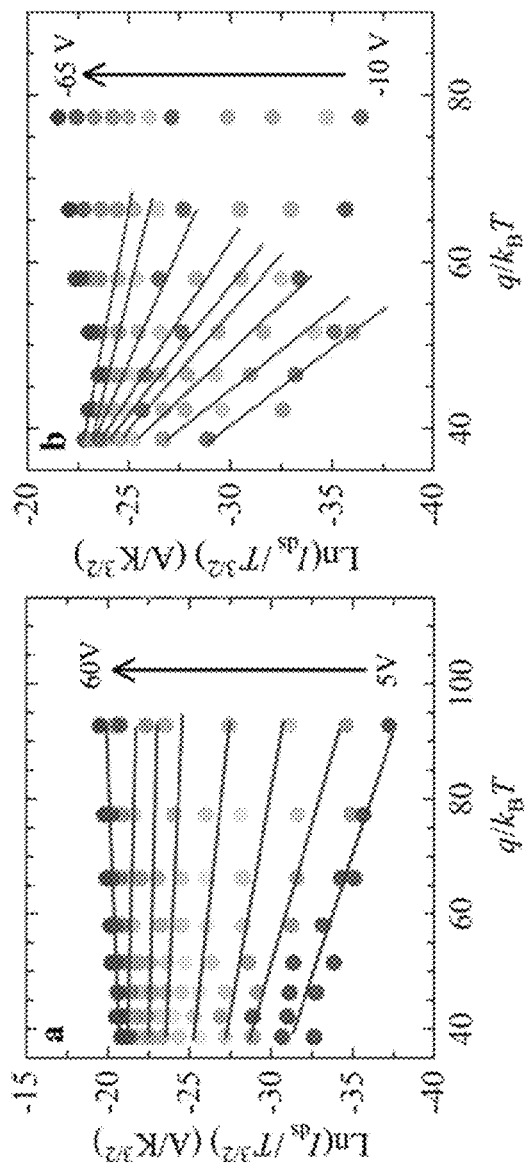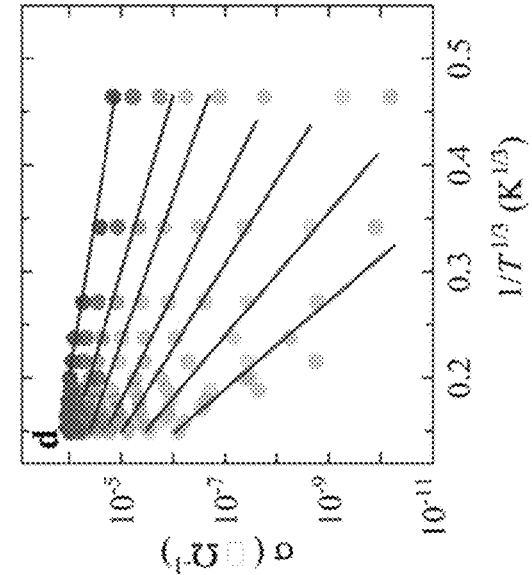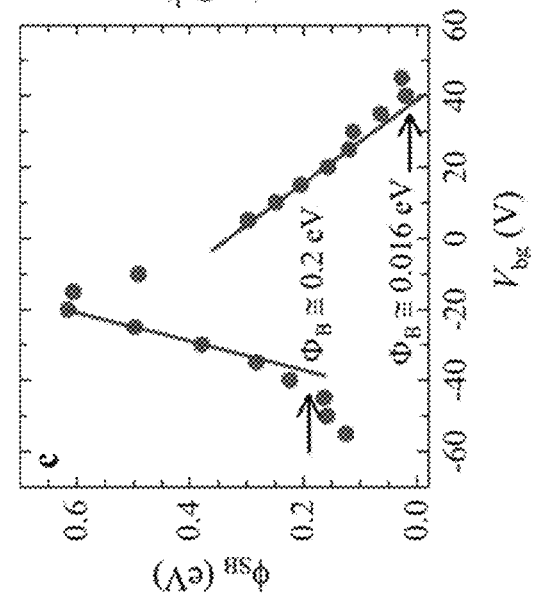

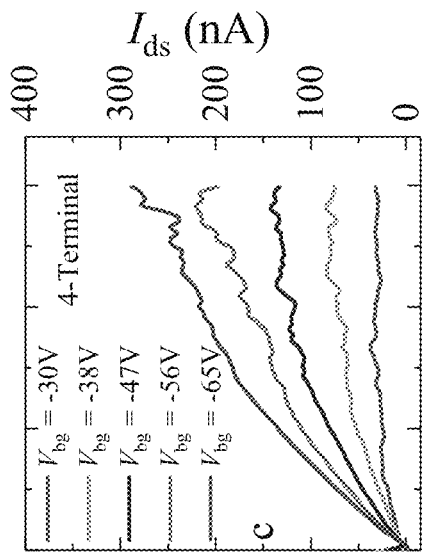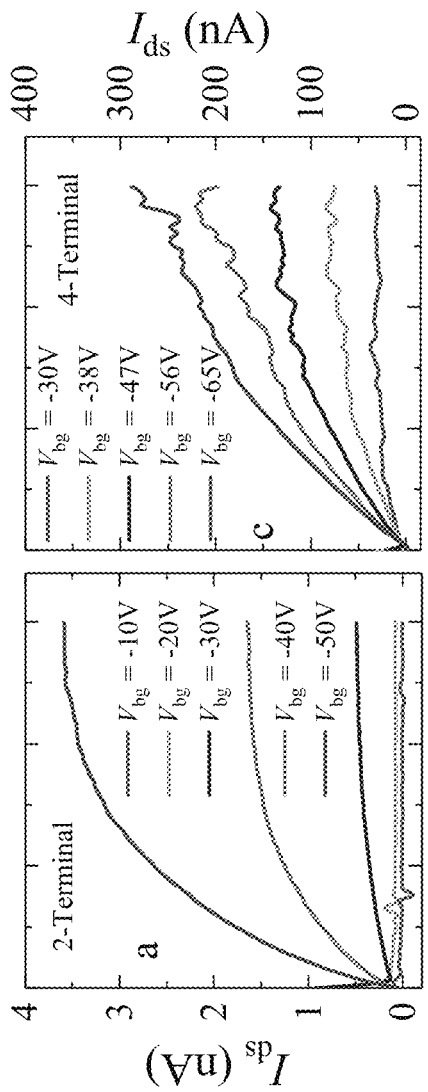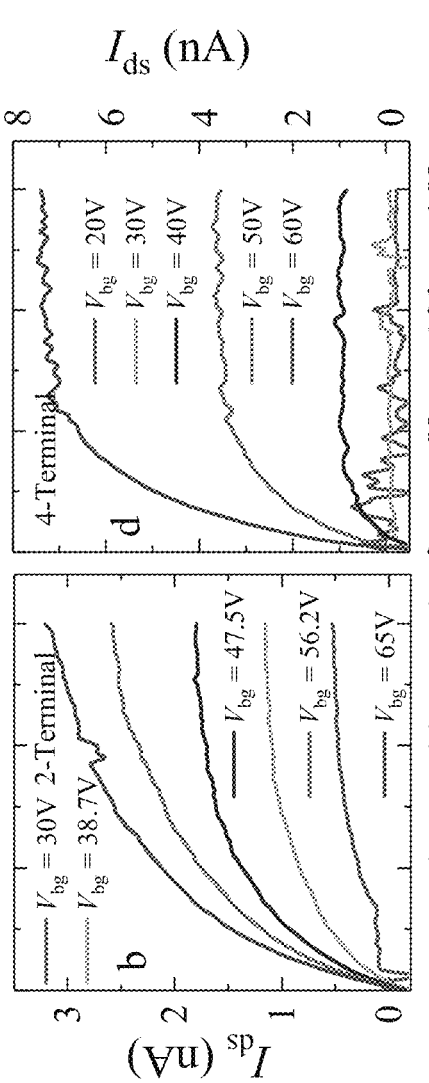

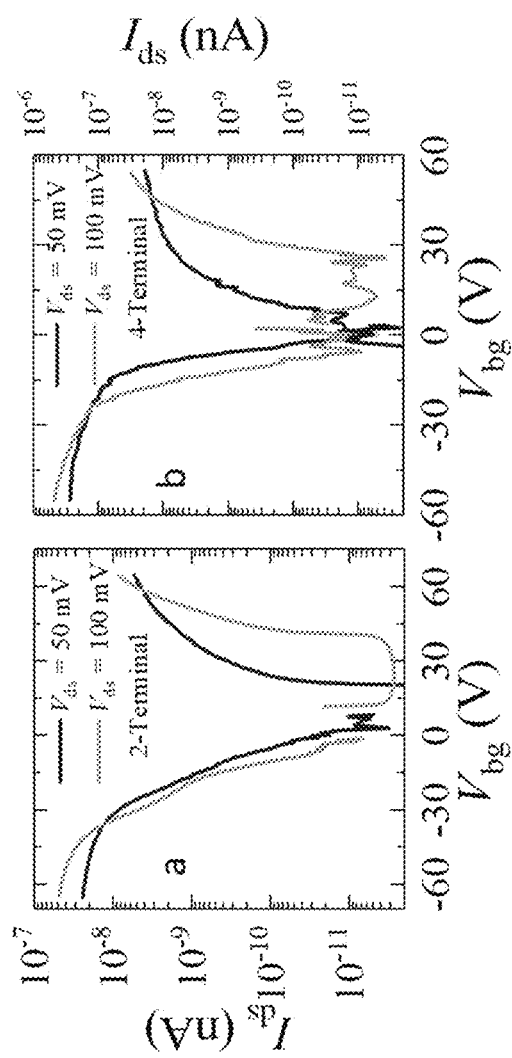

PHASE MODULATORS BASED ON AMBIPOLAR FIELD-EFFECT TRANSISTORS

CROSS-REFERENCE TO RELATED APPLICATIONS

The present application claims the benefit of U.S. Patent Application Ser. No. 62/741,020, filed on Oct. 4, 2018. The forgoing U.S. Patent Application is hereby incorporated by reference in its entirety.

RESEARCH AND DEVELOPMENT

This invention was made with government support under Grant No. W911NF-11-1-0362 awarded by the US Army Research Office and Grant No. DMR-1229217 awarded by the National Science Foundation. The government has certain rights in this invention.

BACKGROUND

Statement of the Technical Field

The present disclosure relates generally to phase modulators. More particularly, the present disclosure relates to phase modulators based on ambipolar field-effect transistors ("FETs").

Description of the Related Art

Conventional phase modulators are made from relatively thick, non-flexible, non-transparent silicon that is not suitable for high-density, portable low-power consumption electronics. The architecture of the conventional phase modulators is multi-component and relatively complex. A more simplified version of conventional phase modulators do not allow for continuously variable phase modulation or for broadband frequency use. Phase modulation is generally understood to control the phase of an output AC electronic signal relative to an applied input AC signal.

SUMMARY

The present document concerns implementing systems and methods for providing a phase modulator. The methods comprise creating an FET by: placing a crystal structure displaying ambipolarity on a substrate comprising an oxide layer and a conductive silicon layer (where the conductive silicon layer provides a gating electrical contact for the phase modulator); and forming source and drain electrical contacts on the crystal structure using e-beam lithography and an e-beam evaporator. The FET is annealed to improve an interface between the crystal structure and the source and drain electrical contacts. The FET is also coated with a dielectric layer to reduce or eliminate hysteresis so that a functionality of the phase modulator is improved.

In some scenarios, the crystal structure comprises at least one of $ReSe_2$, $MoSe_2$, black phosphorous, and alpha-$MoTe_2$. The crystal structure may comprise a number of crystal layers (e.g., 1-10) selected to provide the phase modulator with flexibility and transparency. The conductive silicon layer provides a gate contact for the phase modulator. The dielectric layer comprises Cytop™.

In those or other scenarios, the methods also comprise: performing electrical characterization to determine a gate voltage of the FET for an ON state at both polarities; and/or removing any remaining mask using acetone prior to the annealing. Additionally or alternatively, the annealing comprises: annealing the FET in a forming gas for a first period of time at a first temperature; and/or vacuum annealing the FET for a second period of time different from the first period of time.

In those or other scenarios, the methods further comprise: performing an iterative process to exfoliate sets of crystal layers from the crystal structure until a given number of atomic layers of crystals remain. A single- to few-atomic layers is proceeded via: a top-down process wherein a bulk crystal is grown followed by a wet or dry exfoliation; or a bottom-up process wherein crystal layers are synthesized on a substrate through a chemical vapor deposition process.

BRIEF DESCRIPTION OF THE DRAWINGS

The present solution will be described with reference to the following drawing figures, in which like numerals represent like items throughout the figures.

FIG. 1A provides a Scanning Transmission Electron Microscopy (STEM) image of an exfoliated $ReSe_2$ single-crystal displaying a chain-like atomic arrangement.

FIG. 1B shows an electron diffraction pattern for a $ReSe_2$ single-crystal when the incident electron-beam is perpendicular to the planar atomic arrangement showing a rectangular planar Brillouin zone.

FIG. 1C provides a micrograph of a typical few layered $ReSe_2$ single-crystal exfoliated onto $SiO_2$ which from AFM (inset) had a step height of 2.7 nm, or was four layers thick (for an inter-planar lattice separation c=0.6702 nm).

FIG. 1D provides a micrograph of the same crystal after deposition of the electrical contacts which consisted of 50 nm of Au on a 5 nm layer of Cr. The larger electrical contacts were used to source (S), drain (D), and measure the current $I_{ds}$ when performing two-terminal measurements. The smaller contacts as $V_1$ and $V_2$ were used for voltage sensing in four-terminal measurements. For this sample, the separation between the current leads was L≅10.5 μm, the width of the channel was w≅3.6 μm and the separation between voltage leads was l≅4.5 μm.

FIG. 1E provides a graph showing a Raman spectra of a $ReSe_2$ monolayer. Given that inversion symmetry was the only symmetry operation present in the monolayer, in few-layers and in the bulk, there was just one Raman active irreducible representation, i.e. $A_g$. Therefore, all peaks were associated with Raman $A_g$ modes.

FIG. 1F provides a Raman spectrum for a crystal composed of five atomic layers.

FIG. 1G provides a Theoretical Raman spectrum for monolayer (solid) and bulk (dashed) $ReSe_2$.

FIG. 2A provides a graph showing drain to source current $I_{ds}$ as a function of the gate-voltage $V_{bg}$ for a ten layer thick $ReSe_2$ crystal. Solid (dashed) lines depict decreasing (increasing) gate-voltage sweeps. Notice the near absence of hysteresis. Both traces were acquired at room temperature under a bias voltage of $V_{ds}$=50 mV. Inset: picture of the FET indicating the configuration of contacts. Source (S) and drain (D) contacts were used to measure for two terminal measurements. The channel length and width of the device was 11.6 μm and 10.9 μm respectively.

FIG. 2B provides a graph showing $I_{ds}$ as a function of $V_{bg}$ for the same sample and for several temperatures ranging from T=300 K to 2 K. Notice the progressive emergence of a threshold gate-voltage which increased upon decreasing T.

FIG. 2C provides a graph showing drain to source current $I_{ds}$ for a n=4 sample as a function of the back-gate voltage $V_{bg}$ in semi-logarithmic scale for several values of the bias voltage $V_{ds}$, measured at T=275 K through a two-terminal configuration.

FIG. 2D provides a graph showing the drain to source current $I_{ds}$ measured via a four-terminal configuration.

FIG. 2E provides a graph showing the drain to source current $I_{ds}$ as a function of $V_{bg}$ for several temperatures measured via a two-terminal configuration in a linear scale. A bias voltage $V_{ds}$=0.3 V was used.

FIG. 2F provides a graph showing the drain to source current $I_{ds}$ in a logarithmic scale and measured through a four-terminal configuration. A bias voltage $V_{ds}$=0.3 V was used.

In FIG. 3A, gray and black markers depict electron- and hole-mobilities, respectively, as extracted from a two-terminal configuration under $V_{ds}$=50 mV. In FIG. 3B, gray and black markers depict hole- and electron-mobilities, respectively. Solid and open circles indicate mobilities extracted from two- and four-terminal configurations, respectively. The drain to source voltage applied to the four-layer sample was $V_{ds}$=0.3 V.

FIG. 4A provides a graph showing drain to source current $I_{ds}$ normalized by a power of the temperature T as a function of charge q=e for the n=10 layers sample and for several positive values of the back gate voltage $V_{bg}$. The data set of FIG. 4A was measured under $V_{ds}$=50 mV. The solid lines are linear fits from which we extracted the gate voltage dependence of the Schottky barrier $\phi_{SB}$ ($V_{bg}$) between metallic contacts and the semiconducting channel.

FIG. 4B provides a graph showing the drain to source current $I_{ds}$ for negative values of $V_{bg}$. The data set of FIG. 4B was measured under $V_{ds}$=50 mV. The solid lines are linear fits from which we extracted the gate voltage dependence of the Schottky barrier $\phi_{SB}$ ($V_{bg}$) between metallic contacts and the semiconducting channel.

FIG. 4C provides a graph showing $\phi_{SB}$ as a function of $V_{bg}$, showing that in the limit of high gate voltages (flat band condition), the extracted Schottky barriers $\Phi_B$ were ~200 meV for holes and ~16 meV for electrons respectively.

FIG. 4D provides a graph showing conductivity $\sigma=I_{ds}/V_{ds}$ (l/w), where l and w are length and width of the semiconducting channel, respectively, as a function of $1/T^{1/3}$ and for several gate voltages. Solid lines are linear fits indicating that the conductivity as a function of T can be described by the two-dimensional variable range hopping expression.

FIG. 5A shows $I_{ds}$ as a function of $V_{bg}$ for a few-layer $ReSe_2$ field effect-transistor at T=275 K. This trace was acquired under a drain supply voltage $V_{dd}$=50 mV. Inset depicts the scheme of measurements where $R_{load}$ is a load resistor and $V_{dd}$ is the bias voltage. $V_{in-ac}$, which is a superposition of DC and AC (~1.5 V) biases, was applied to the back-gate while $V_{out}$ corresponds to the read-out voltage. Solid squares indicate the DC back-gate voltages chosen to superimpose an oscillatory AC signal to extract the relative phase-shift between $V_{in}$ and $V_{out}$. FIG. 5B shows relative phase shift as a function of $V_{bg}$. By increasing $V_{bg}$ from negative values we tuned the phase-shift from 0° to 90° and then to ~180°. This is clearly illustrated by the graph of FIG. 5C, FIG. 5D and FIG. 5E which display $V_{in}$ (solid traces) and $V_{out}$ (dotted traces) as a function of time t for various gate voltages.

FIGS. 6A-D (collectively referred to herein as "FIG. 6") provide graphs showing drain to source current $I_{ds}$ as a function of the bias voltage $V_{ds}$ for a 3-4 layers $ReSe_2$ FET device. FIGS. 6A and 6B provide graphs showing $I_{ds}$ as a function of $V_{ds}$ measured with 2- and a 4-terminal configuration respectively, and for several negative values of the applied gate voltages $V_{bg}$. FIGS. 6C and 6D provide graphs showing $I_{ds}$ as a function of $V_{ds}$ measured via 2- and 4-terminal configurations, and for several positive values of $V_{bg}$.

FIGS. 7A and 7B provide graphs showing $I_{ds}$ as a function of $V_{ds}$ measured with 2 terminal configurations at several negative and positive gate voltages, respectively. FIGS. 7C and 7D provide graphs showing $I_{ds}$ as a function of $V_{ds}$ for several negative and positive values of the gate voltage measured with a 4-terminal configuration.

FIGS. 8A-B (collectively referred to herein as "FIG. 8") provide semi-logarthmic plots of $I_{ds}$ as a function of $V_{bg}$ for the device characterized in FIG. 7 which was measured at room temperature using a 2-terminal and a 4-terminal configuration, respectively. Both configurations indicate ambipolar response.

FIG. 10A shows $I_{ds}$ as a function of $V_{ds}$ for several values of the applied gate voltage $V_{bg}$. Notice the nearly linear response at small bias. FIG. 10B shows $I_{ds}$ as a function of $V_{bg}$ displaying ambipolar response. For this sample one extracts an electron field-effect mobility of ~100 $cm^2/Vs$ via a 2-terminal configuration. Inset shows the optical image of the $ReSe_2$ FET device of channel length L=12.5 μm and width w=6.7 μm.

DETAILED DESCRIPTION

Figure 3A:
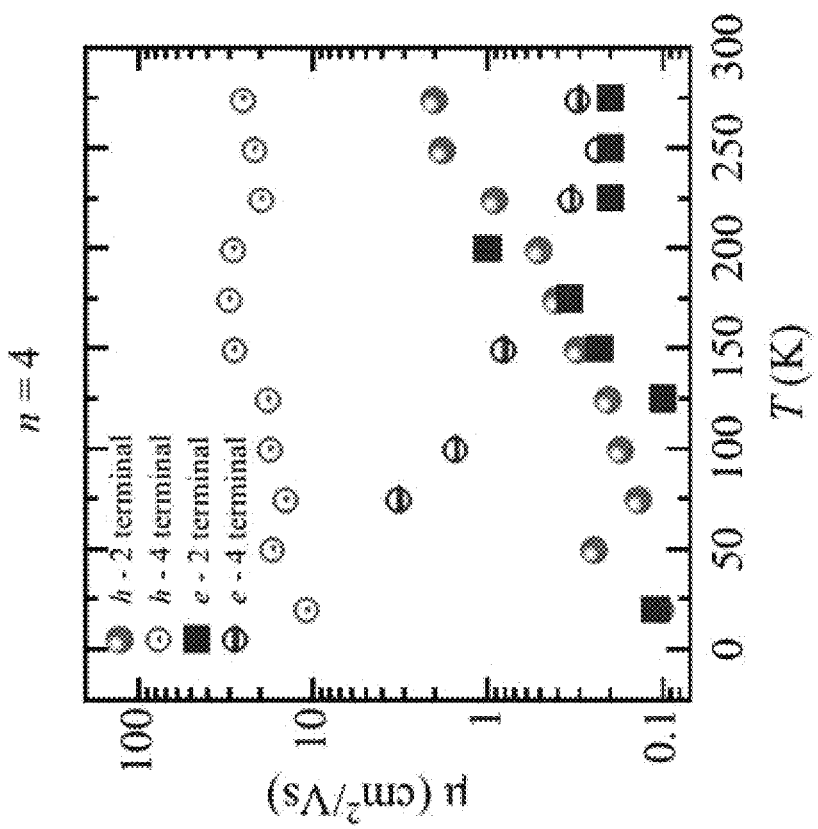
FIGS. 3A-3B provide graphs showing electron- and hole-mobilities as a function of the temperature as extracted from the MOSFET transconductance formula for a (a) n=10 and a (b) 4-layers thick sample.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

The present solution generally concerns ambipolar FETs. The ambipolar FETs are fabricated from multi-layered material (e.g., $ReSe_2$, $MoSe_2$, black phosphorous, and alpha-$MoTe_2$), mechanically exfoliated onto a $SiO_2$ layer grown on p-doped Si. In contrast to previous reports on thin layers (~2 to 3 layers), field-effect carrier mobilities are extracted in excess of $10^2$ cm$^2$/Vs at room temperature in crystals with nearly ~10 atomic layers. These thicker FETs also show nearly zero threshold gate voltage for conduction and high ON to OFF current ratios ~$10^7$ when compared to the FETs built from thinner layers. It has been demonstrated that it is possible to utilize this ambipolarity to fabricate logical elements or digital synthesizers. For instance, one can produce simple, gate-voltage tunable phase modulators with the ability to shift the phase of the input signal by either 90° or nearly 180°. Given that it is possible to engineer these same elements with improved architectures, for example on h-BN in order to decrease the threshold gate voltage and increase the carrier mobilities, it is possible to improve their characteristics in order to engineer ultra-thin layered logic elements based on $ReSe_2$, $MoSe_2$, black phosphorous, and/or alpha-$MoTe_2$.

Layered rhenium-based transition metal dichalcogenides (TMDCs) (or $ReX_2$ where X=S, Se) are the subject of a renewed interest due to their unique anisotropic optoelectronic properties. Due to a lattice distortion these materials crystallize in a distorted triclinic-1T'-phase instead of the more conventional trigonal prismatic, or 2H-phase, and the rhombohedral or 3R-phase. The crystal structure of $ReX_2$ is special due to their in-plane motif, i.e., four Re atoms are arranged in a diamond-like shape with these diamonds forming atomic chains along the b-direction.

In contrast to other more intensively studied layered dichalcogenides (such as $Mo(S,Se)_2$ or $W(S,Se)_2$) which display a transition from an indirect to a direct band gap when exfoliated down to the monolayer limit, the Re-based TMDCs show nearly layer-independent ($ReS_2$), or very weakly layer-dependent ($ReSe_2$), optical and vibrational properties. This has been interpreted as evidence for an extremely weak inter-planar coupling although angle resolved photoemission spectroscopy observes an out-of-plane electronic dispersion, indicating that in fact the interlayer coupling in $ReSe_2$ is appreciable.

However, their triclinic symmetry makes both compounds optically biaxial, resulting in an anisotropic planar response with respect to the optical polarization. The Raman-active modes of thin layers of both compounds have also been found to be anisotropic.

According to Density Functional Theory ("DFT") calculations, bulk and monolayer $ReS_2$ have nearly identical band structures with direct bandgaps of 1.35 eV and 1.44 eV, respectively. These values are relatively close to those extracted from high resolution electron energy loss spectroscopy, which finds direct band gaps of 1.42 eV and of 1.52 eV for bulk and monolayer $ReS_2$, respectively. In contrast, the DFT calculations presented in a document entitled "Intricate Resonant Raman Response In Anisotropic $ReS_2$" written by McCreary et al. indicate that $ReS_2$ displays an indirect band gap that is very close in energy with respect to the direct one in the bulk and also in monolayers. Photoemission presented in a document entitled "Electronic Bandstructure And Van Der Waals Coupling of $ReSe_2$ Revealed By High-Resolution Angle-Resolved Photoemission Spectroscopy" written by Hart el al. suggests that $ReSe_2$ would also possess an indirect band gap at all thicknesses which is consistent with Local Density Approximation calculations revealing gaps of 0.92 eV for the bulk and 1.22 eV for monolayer. However, photoluminescence measurements at T=10 K coupled to GW and Bethe-Salpeter calculations find that the bandgap of $ReSe_2$ increases as the number of layers decreases, displaying values of 1.37 eV for the bulk and of 1.50 eV for the monolayer, while maintaining a direct band gap and independence of the number of layers. In comparison with the other TMDCs crystallizing in 2H-phase, a direct band gap approaching ~1.5 eV would make these compounds particularly appealing for photosensing and photovoltaic applications (according to the Shockley-Queisser limit). However, as seen from the above results, the nature of the band gap in $ReSe_2$, i.e., direct or indirect, remains unclear. To date, there are no reports on room temperature photoluminescense ("PL") from $ReSe_2$. Despite multiple attempts, room temperature PL data was unable to be collected from this compound, although a PL signal was easily extracted from those compounds crystallizing in the 2H structure, which are known to display an indirect band bap in the bulk. This observation is particularly difficult to reconcile with a direct band gap.

Nevertheless, photodetectors based on high-quality chemical vapor deposition grown $ReS_2$ were reported to yield photoresponsivities as high as $R \cong 604$ A/W corresponding to an enormous external quantum efficiency $EQE=1.50\times 10^5$% and a specific detectivity $D^* \cong 4.44 \times 10^8$ m $(Hz)^{1/2}$/W. For $ReS_2$ stacked onto h-BN, values as high as $R=88\ 600$ A/W, $EQE=2\times 10^7$%, and $D^*=1.182\times 10^{10}$ m $(Hz)^{1/2}$/W were reported, indicating that the substrates play a significant role on the performance of these compounds. As for $ReSe_2$, values as high as $R=3.68\times 10^4$ A/W were reported after improving the resistance of the source contact via a triphenyl phosphine-based n-doping technique. These pronounced photoresponsivities would suggest that the band gap of these materials might indeed be direct.

Here, it is shown that FETs based on multilayered triclinic $ReSe_2$ mechanically exfoliated onto $SiO_2$, display ambipolar behavior with very small threshold back-gate voltages, current ON to OFF ratios exceeding $10^6$ and electron field-effect mobilities approaching 380 $cm^2$/Vs at room temperature. Density Functional Theory calculations were found to replicate the observed Raman spectra for the bulk and for the monolayers concluding that all active Raman modes belong to the $A_g$ irreducible representation given that inversion is the only symmetry operation compatible with its structure. It is also shown that the ambipolarity of $ReSe_2$ opens up interesting opportunities for complementary logic electronics: for instance, it is shown that logic operations (e.g., an inverter) can be produced using a combination of an n-$ReS_2$ FET with p-black phosphorus FET.

Results and Discussion

FIG. 1a displays a STEM image of an exfoliated $ReSe_2$ single-crystal. The high crystallinity is confirmed by the electron diffraction pattern collected along a direction perpendicular to the planes or along the [001] direction (see FIG. 1b). Given its structural symmetry and similarity to $ReS_2$, $ReSe_2$ also tends to exfoliate in the form of nearly rectangular flakes, as seen in FIG. 1c, which shows a micro-image of the $ReSe_2$ flake exfoliated onto a 285 nm thick $SiO_2$ layer grown on p-doped Si. As shown in the inset, according to Atomic Force Microscopy ("AFM"), the thickness of the exfoliated crystal shown in FIG. 1c is approximately four atomic layers for an inter-planar lattice separation c=0.6702 nm. FIG. 1c shows a micro-image of the $ReSe_2$ flake exfoliated onto a 285 nm thick $SiO_2$ layer grown on p-doped Si. FIG. 1d shows the same crystal after the deposition of the electrical contacts, i.e., 50 nm of Au on 5 nm of Cr. The electrical contacts were deposited using standard e-beam lithography and e-beam evaporation techniques. This configuration of six contacts allows one to measure the Hall-effect to extract the Hall-mobilities which will be reported elsewhere. FIGS. 1e and 1f display the experimental Raman scattering spectra for a monolayer and a five-layer crystal, respectively. Their expected theoretical spectra, from which the peaks are indexed in FIG. 1e, are shown in FIG. 1g. In order to compare with the experimental Raman results, ab-initio DFT and Density Functional Perturbation Theory ("DFPT") calculations were performed for monolayer and bulk $ReSe_2$ as implemented in the plane wave code CASTEP. The starting structure for the bulk crystal was obtained from a document entitled "Lattice Dynamics Of The Rhenium And Technetium Dichalcogides" written by Wolverson et al. Monolayer, few-layer and the bulk crystal exhibit just inversion symmetry and belong to the pi space group. Local Density Approximation ("LDA") using the Ceperly-Alder-Perdew and Zunger ("CA-PZ") functional with 6×6×1 Monkhorst-Pack K-points and a plane wave cut-off of 440 eV with a norm-conserving pseudopotential was implemented in the calculations. The structures were relaxed, including the unit cells, until the forces became smaller than 0.01 eV/Å and with self-consistent energy tolerances inferior to $5\times 10^{-7}$ eV/atom. For the monolayer case a vacuum of 21 Å between the layers was considered. Due to fact that the only symmetry operation present in the monolayer, few-layers, and bulk, is inversion symmetry, there is just one Raman active irreducible representation, i.e. $A_g$. Thus, in FIG. 1e the Raman peaks are labeled in a sequence from low to high frequencies as $A_g$ with increasing exponent number. The following TABLE 1 which provides the calculated phonon frequencies for all the bulk and monolayer Raman modes.

TABLE 1

| Raman Active Mode | $ReSe_2$ Mono Layer Frequency $(cm^{-1})$ | $ReSe_2$ bulk crystal Frequency $(cm^{-1})$ |
|---|---|---|
| $A_g^1$ | 103.52 | 108.52 |
| $A_g^2$ | 116.01 | 119.14 |
| $A_g^3$ | 122.34 | 120.37 |
| $A_g^4$ | 126.02 | 125.47 |
| $A_g^5$ | 163.25 | 161.34 |
| $A_g^6$ | 176.04 | 174.36 |
| $A_g^7$ | 179.68 | 177.54 |
| $A_g^8$ | 183.04 | 182.05 |
| $A_g^9$ | 195.44 | 193.98 |
| $A_g^{10}$ | 198.54 | 197.47 |
| $A_g^{11}$ | 206.94 | 207.78 |
| $A_g^{12}$ | 220.43 | 218.51 |
| $A_g^{13}$ | 235.29 | 234.93 |
| $A_g^{14}$ | 242.97 | 240.74 |
| $A_g^{15}$ | 252.12 | 249.24 |
| $A_g^{16}$ | 266.39 | 263.15 |
| $A_g^{17}$ | 287.97 | 285.00 |
| $A_g^{18}$ | 298.53 | 295.40 |

Figures 7A, 7B, 7C, 7D:
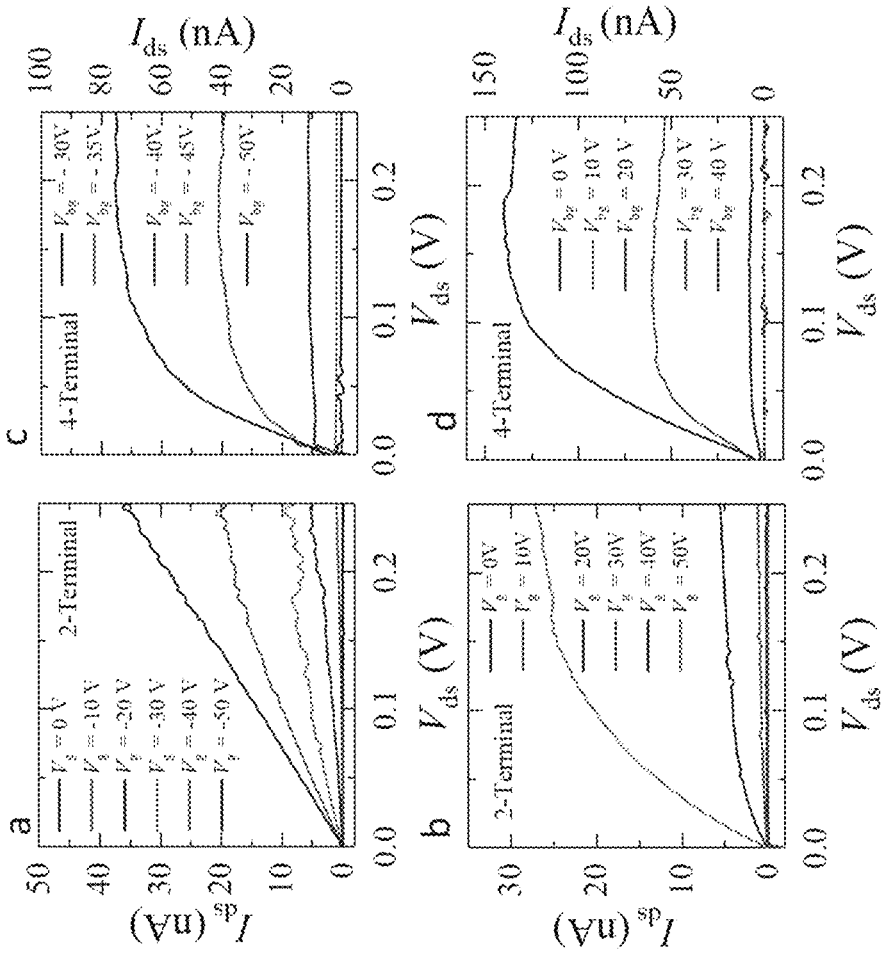
FIG. 7A-D (collectively referred to herein as "FIG. 7") provide graphs showing drain to source current $I_{ds}$ as a function of the bias voltage $V_{ds}$ for a second thin (3-4 layers) $ReSe_2$ FET similar to the one discussed in the main text.

FIGS. 2a-2f are collectively referred to as FIG. 2. FIG. 2 presents the overall electrical response of two FETs built from exfoliated flakes composed of 4 and 10 layers, respectively. A large variability was observed in the response of the characterized FETs, with thicker crystals displaying considerably larger field-effect mobilities and smaller hysteresis and threshold gate-voltages relative to thinner ones as illustrated by both examples in FIG. 2 (see also FIGS. 6 and 7 for electrical data from other samples). The lower mobilities and poorer overall electrical performance of FETs built from thinner $ReSe_2$ crystals have been widely observed in transition metal dichalcogenides and attributed to a more pronounced role for Coulomb scattering from the impurities at the interface with the $SiO_2$ layer and particularly from the adsorbates accumulated at the top layer of the semiconducting channel. In thicker crystals/flakes the top layers play the role of capping layers, protecting the middle layers that carry most of the electrical current, from oxidation and adsorbates, while the bottom layers can partially screen the spurious charges at the interface. Simulations have also shown that carrier mobilities peak for samples having approximately 10 layers. FIG. 2a displays the drain to source current $I_{ds}$, extracted under a bias voltage $V_{ds}=50$ mV, as a function of gate voltage $V_{bg}$ for a FET based on an n=10 layers crystal. One observes i) the near absence of hysteresis and ii) a threshold gate-voltage $V_{th} \cong \pm 40$ V beyond which conduction occurs at room temperature. Notice also the ambipolar behavior, or electron and hole-conduction, with ON to OFF current ratios of nearly $\sim 10^7$ for electrons and of $\sim 10^6$ for holes, albeit with poor subthreshold swings of typically $\sim 3.5$ V per decade. Previously ambipolarity was reported only for black phosphorus, for MoSe$_2$, and for α-MoTe$_2$. Hence, ReSe$_2$ becomes the fourth 2D material to display ambipolarity in absence of ionic liquid gating or dielectric, heterostructure or contact engineering, thus displaying a potential for applications in in complementary logic electronics.

FIG. 2b provides a graph showing $I_{ds}$ as a function of $V_{bg}$ for the same sample but for several temperatures T. As T is lowered, one needs to reach progressively higher threshold gate voltages $V^t_{bg}$ to observe carrier conduction. This increase was observed in $V^t_{bg}$ in most of the TMDs measured, ascribing it to a combination of factors, such as disorder-induced localization at the interface with the SiO$_2$ layer, and the role of the Schottky barriers at the electrical contacts. FIGS. 2c-2d illustrate a comparison between 2- and 4-terminal measurements performed in a FET based on a ReSe$_2$ crystal with n=4 layers. Here, 2-terminal measurements indicate that current flows through the source and drain contacts which are also used for sensing the voltage. The overall response of this FET is noticeably inferior with respect to the n=10 one: under the same bias voltage $V_{ds}$=50 mV one extracts nearly 100 times less current leading to ON to OFF ratios reaching only 10$^4$ and 10$^3$ for holes and electrons, respectively. The rather large $V^t_{bg}$ of ~+40 and ~+30 V at T=275 K for the n≅4 sample suggest that this sample is considerably more disordered than the n≅10 layers one: a large fraction of the initially accumulated carriers become trapped by defects and spurious charges in the material and at the interface. FIGS. 2e-2f provide graphs showing $I_{ds}$ as a function of $V_{bg}$ for measurements based on 2- and 4-terminal configurations respectively, at several temperatures. Notice how the $V^t_{bg}$ are nearly T-independent, supporting the notion that they are associated with a constant number of defects in the material and/or with spurious charges at the interface.

Figure 3B:
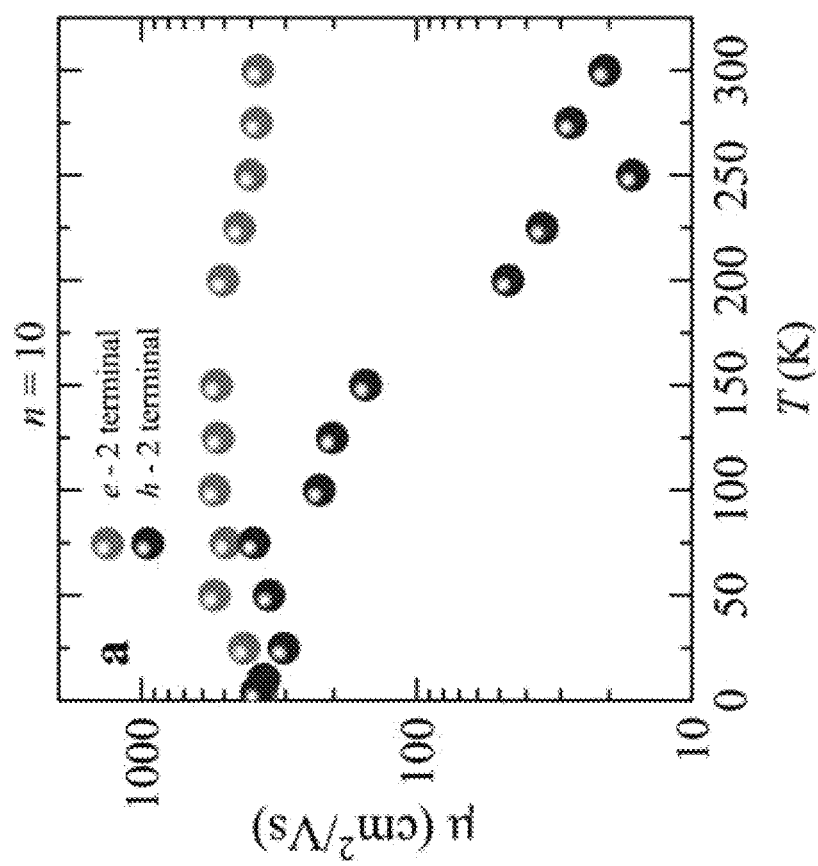

FIGS. 3a-b are collectively referred to herein as FIG. 3. FIG. 3 displays the field-effect mobilities extracted from both samples (n=10 and n=4 layers) as a function of the temperature T, when using the conventional MOSFET transconductance formula, i.e. $\mu_{FE}=c_g^{-1} d\sigma/dV_{bg}$, where $\sigma=j_{ds}/E_{ds}$ is the conductivity and $c_g=e_r e_0/d=12.116\times10^{-9}$ F/cm$^2$ is the gate capacitance (where d=285 nm is the thickness of the SiO$_2$ layer). For the thicker n=10 sample, the FET response was measured only via the 2-terminal configuration. For the thinner n=4 sample, the mobility was measured using the 2- as well as the 4-terminal method, since the first one yielded unusually small mobilites when compared to those of the n≅10 samples. The intention was to verify if this difference would be attributable to worse electrical contacts. Remarkably, for the n=10 sample, whose data is shown in FIG. 3a, nearly temperature independent electron mobilities were observed with values around ~400 cm$^2$/Vs. Meanwhile the hole mobilities varied significantly, increasing by more than one order of magnitude upon cooling, that is from ~20 cm$^2$/Vs at room temperature to ~400 cm$^2$/Vs at 75 K. FIG. 3b displays the 2- as well as the 4-terminal electron and hole mobilities for n=4 sample as a function of the temperature. Solid circle and square dots depict hole and electron mobilities measured through a 2-terminal configuration, respectively. Circled dots and circled lines depict hole and electron mobilities measured in a 4-terminal configuration, respectively. In the whole range of temperatures, the mobilities of the n=4 sample were considerably smaller than those of the n=10 one, which displayed two-terminal hole mobilities on the order of just 1 cm$^2$/Vs and electron mobilities one order of magnitude smaller. These values for the 2-terminal mobility of the thinner sample were very similar to those previously reported.

Figure 9:
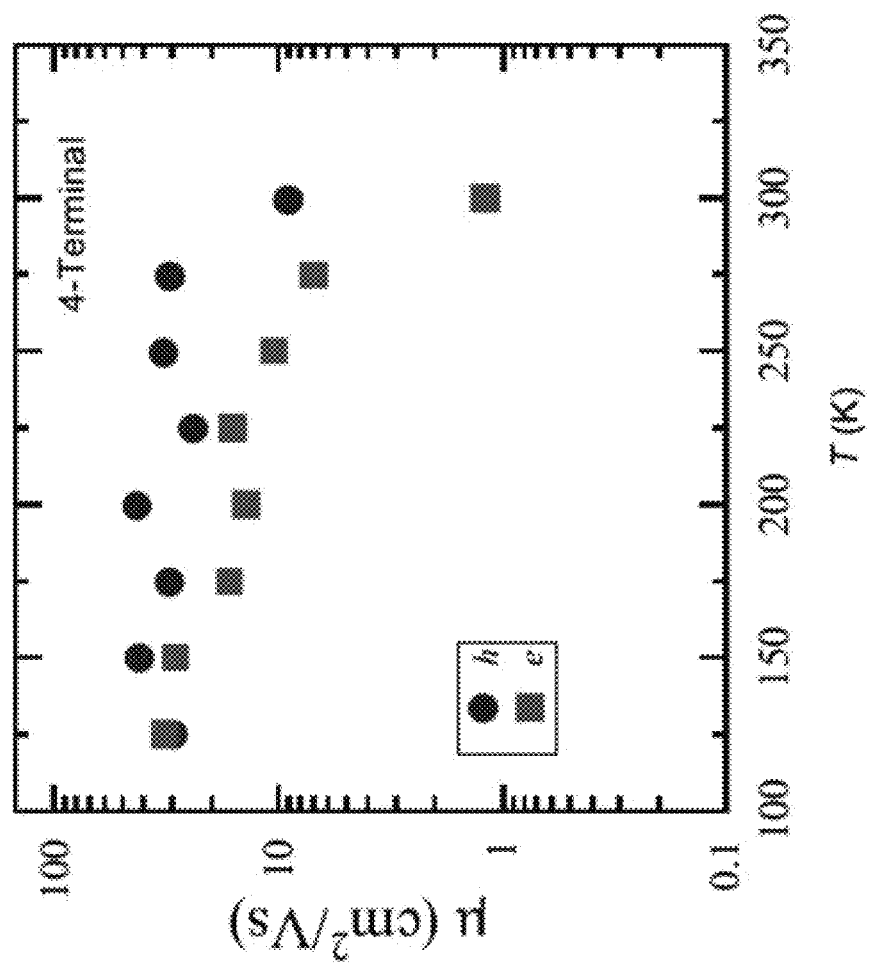
FIG. 9 provides a graph showing field-effect mobility extracted from the previously discussed 3-4 layer thick sample measured via a 4-terminal configuration. The room temperature mobilities for electron and holes are in the order of ~1 $cm^2/Vs$ and 10 $cm^2/Vs$, respectively. The mobilities increase upon cooling down saturating at a value of 40-50 $cm^2/Vs$ below 200 K.
Figures 10A, 10B:
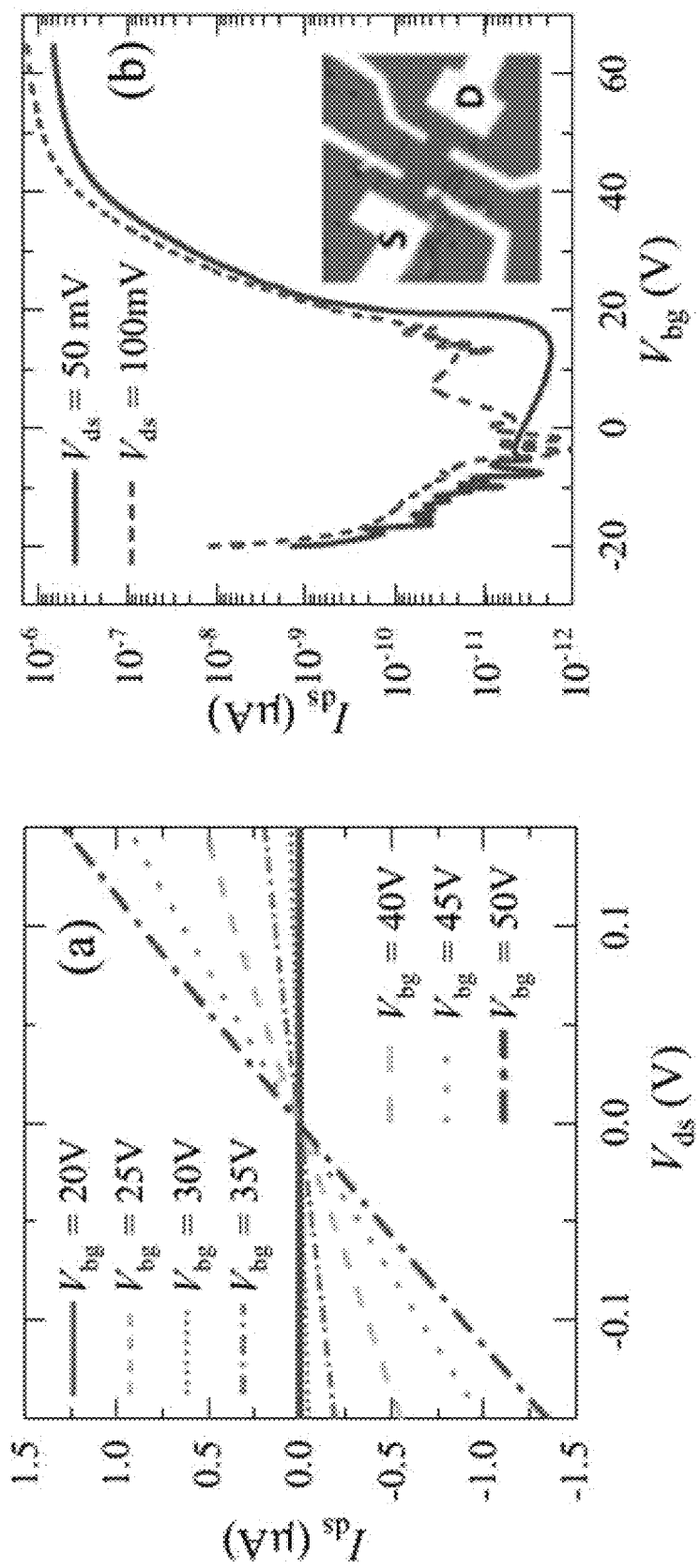
FIGS. 10A-B (collectively referred to herein as "FIG. 10") provide graphs showing an electrical characterization of a $ReSe_2$ based FET composed of 8 to 9 layers.

The mobility values for the n=10 sample were considerably higher than those previously reported for multilayered samples, which have been found to display electron-doped-like responses with two-terminal field-effect mobilities ranging from only ~1 to 10 cm$^2$/Vs. In FIGS. 8-10, data was included from a second multi-layered sample, i.e. n=8-9 layers, which also displayed field-effect electron mobilities in excess of 10$^2$ cm$^2$/Vs, with considerably smaller threshold gate-voltages relative to the thinner crystals. This indicates that thicker crystals indeed display higher mobilities and that this behavior is not confined to the sample shown here. In thinner samples, charge conduction tends to be dominated by higher contact resistances when measured in a 2-terminal configuration. Therefore, in order to extract the nearly intrinsic mobility of the n=4 sample we re-measured it through a 4-terminal configuration. From these measurements, hole-mobilities of ~10 cm$^2$/Vs and an order of magnitude smaller electron mobilities at room temperature were obtained. This value for the 4-terminal hole-mobility was similar to that previously reported on the same material after transferring onto h-BN substrates. In contrast, the electron mobilities of the present solution are similar to their values extracted from ReSe$_2$ FETs on SiO$_2$. Unsurprisingly, this indicates that the substrates, i.e., their roughness, presence of dangling bonds and of trapped charges affect the mobilities of thin ReSe$_2$ samples. Impurities should play a more predominant role in thinner crystals. These impurities are those located at the interface with the SiO$_2$ layer as well as adsorbates on top of the channel resulting from air exposure during the fabrication process. Observations imply that previous reports underestimated the intrinsic performance of this compound. Degradation under ambient conditions was discarded after evaluating the time dependence of the Raman signal, i.e. amplitude and width at half maximum of several of the observed Raman peaks as a function of time. There was no detection of deterioration in a time scale of a few days indicating that the previously discussed scattering mechanisms as well as the Schottky barriers at the electrical contacts are likely to be the main factors limiting the performance of ReSe$_2$ field-effect transistors. Notice that the mobility $\mu^h_{FE}$ of the holes in FIG. 3a increased considerably as T was lowered suggesting that it was phonon limited, or that phonons also played quite a relevant role at room temperature. In contrast, the electron and hole mobilities for the thin n=4 layers sample showed quite different trends as a function of the temperature. The 2-terminal electron ($\mu^e_{2T}$) and hole ($\mu^h_{2T}$) mobilites decreased as a function of the temperature, indicating that the transport of charges was dominated by the Schottky barriers, or that the thermionic emission processes accross the contacts were suppressed at lower temperatures. This contrasting behavior also implied that the mobilities were sample dependent due in part to fluctuations in the quality of the contacts. The 4-terminal mobilities measured on the same device yielded a hole mobility ($\mu^h_{4T}$) that remained nearly constant at a value of ~20 cm$^2$/Vs as a function of the temperature. In contrast, the electron mobility ($\mu e_{4T}$) increased from 0.3 cm$^2$/Vs at 300 K to 3 cm$^2$/Vs at 75 K. The previous report by Zhang et al. also found nearly constant mobilities as a function of the temperature when h-BN was used as substrate.

To evaluate the quality of the electrical contacts, two-terminal measurements were performed in the n=10 sample to evaluate $I_{ds}$ as function of $V_{bg}$ under a fixed $V_{ds}$=50 mV at several temperatures (see FIG. 4). This evaluation was important since, as illustrated by FIG. 6, the $I_{ds}$-$V_{ds}$ characteristics were non-linear confirming a prominent role for the Schottky barriers at the level of the electrical contacts with a concomitant performance loss in electrical transport in ReSe$_2$-based FETs. The transport of electrical charges across a Schottky barrier, resulting from the mismatch between the band structure of the metal and that of the two-dimensional material, is usually described in terms of the two-dimensional thermionic emission Mathematical Equation (1).

$$I_{ds} = AA^*T^n\left[-\frac{q\phi_{SB}}{k_BT}\right] \quad (1)$$

where A is contact area of junction, A* is the two-dimensional equivalent Richardson constant, n is an exponent acquiring a value of either 2 for a three-dimensional semiconductor or of 3/2 for a two-dimensional one, q=e is the electron charge, $\phi_{SB}$ is the Schottky barrier height, and k$_B$ is the Boltzmann constant. In order to evaluate $\phi_{SB}$ or the effective Schottky barrier at the contacts, in the top panel of FIGS. 4a-4b the drain-source current $I_{ds}$ was plotted normalized by the power of the temperature T$^{3/2}$ as a function of (q=e)/k$_B$T as obtained under several values of V$_{bg}$. FIG. 4a corresponds to curves collected under V$_{bg}$>0, while FIG. 4b corresponds to curves measured under V$_{bg}$<0. Solid lines in both panels are linear fits from which the value of $\phi_{SB}$ (V$_{bg}$) was extracted. FIG. 4c displays the extracted values of $\phi_{SB}$ as a function of V$_{bg}$. The Schottky barrier height $\Phi_B$ for electrons and holes were extracted from $\phi_{SB}$ at large absolute values of the gate voltage (flat band condition indicated here by deviations to linear fits) yielding values of ~0.016 and 0.2 eV, respectively. These values must be contrasted with the work function W=5.6 eV and the band gap of $\Delta$=1.19 eV reported for ReSe$_2$. A Schottky barrier should be expected as the difference in energy between the work function of the deposited metal contacts Cr, or 4.5 eV, and the electron affinity $E_{EA}\cong$(W−$\Delta$/2)$\cong$5.005 eV of ReSe$_2$, or $\Phi_B\cong$+0.505 eV. This value implies that Cr should pin the Fermi level within the conduction band of ReSe$_2$ thus explaining the rather small $\Phi_B$~0.015 eV extracted under positive gate voltages. The existence of a very small Schottky barrier could result from extrinsic factors like polymer residues resulting from the fabrication process. Remarkably, one also obtains a rather small Schottky barrier for holes of just $\Phi_B\cong$0.2 eV, which is an unexpected result. Notice that a similar discrepancy was already observed by us for $\alpha$-MoTe$_2$. Schottky barriers are likely the main factor limiting the hole-conduction in our ReSe$_2$ FETs while their asymmetry would explain the larger electron mobilities.

Figures 5A, 5B, 5C, 5D, 5E:
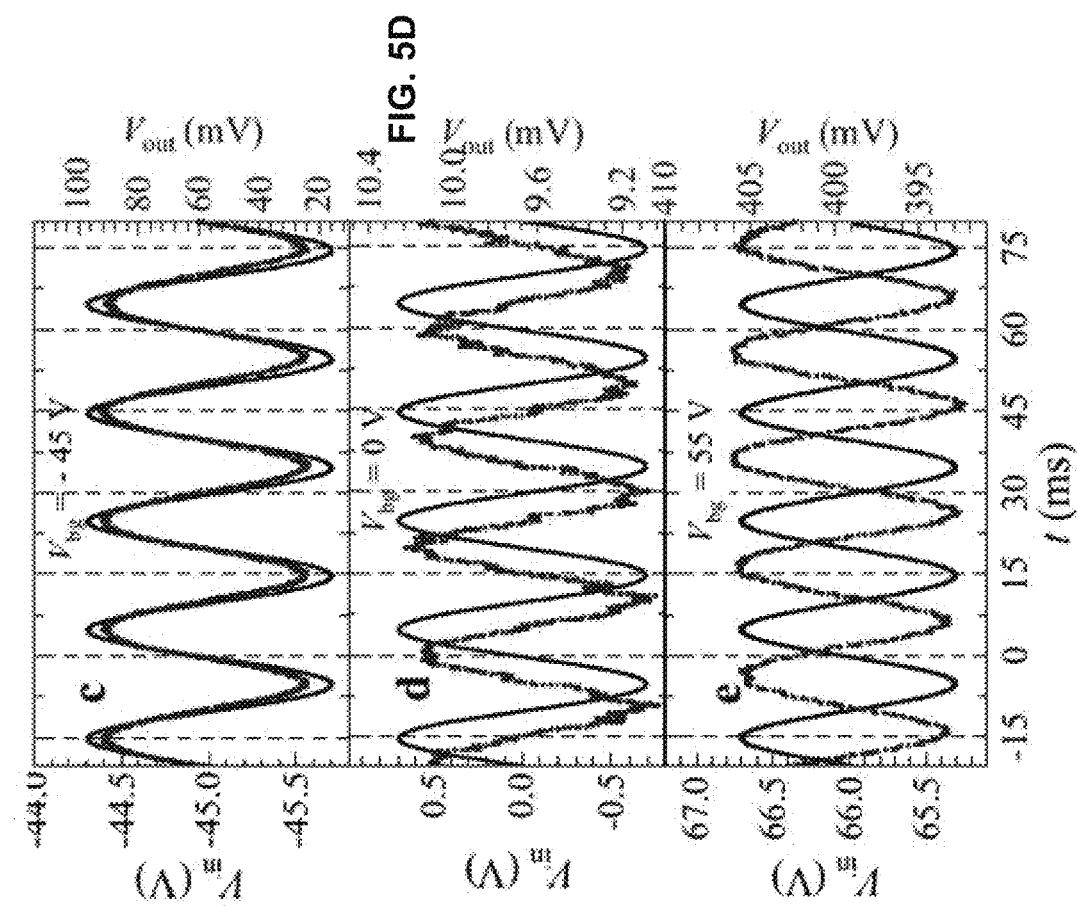
FIGS. 5A-5E (collectively referred to herein as "FIG. 5") provides graphs showing phase-modulation based on few-layer ambipolar $ReSe_2$ FETs.
Figure 11:
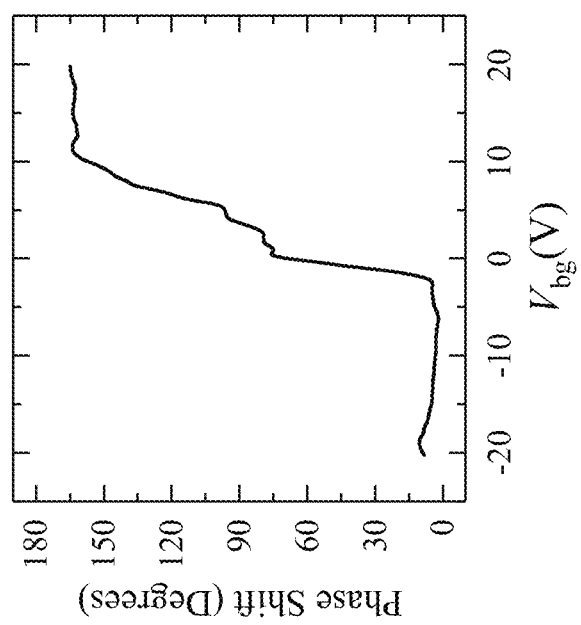
FIG. 11 provides a graph showing the relative phase-shift as a function of back gate voltage for a second, n≅10 layers, sample. Notice also that by increasing $V_{bg}$ from negative values one is able to tune the phase to 90° and subsequently to ~180°.

Transistors displaying ambipolar behavior could be useful for applications in telecommunications since they could simplify circuit design or improve the performance of signal processing. For instance, the ambipolarity of ReSe$_2$ can be useful for the development of a phase shift modulator. For instance, FIG. 5 displays the response of a n=4 ReSe$_2$ based field-effect transistor, connected in series to a load resistor, upon the introduction of a sinusoidal modulation superimposed on its back-gate voltage, which we rename as the input-voltage, or V$_{in}$=V$_{bg}$+V$_{ac}$ ($\cong$1.5 V). The readout oscillatory voltage V$_{out}$ is collected at a point located between the load-resistor, in this case R$_{load}$=100 k$\Omega$, to which we apply a load voltage V$_{dd}$=50 mV with respect to the ground, and the FET (see schematic of the circuit in FIG. 5a). FIG. 5a also displays $I_{ds}$ as a function of V$_{bg}$ where we placed three solid squares indicating the constant values of V$_{bg}$ upon which oscillatory V$_{ac}$ signals were superimposed while the corresponding V$_{out}$ were collected. FIG. 5b displays the phase shift of the V$_{out}$ signal relative to V$_{in}$ collected with a Lock-In amplifier as the gate voltage was swept from negative to positive values. Similarly to ambipolar a-MoTe$_2$, the relative phase between both signals was observed to shift from ~0° for V$_{bg}$<0 V, to ~90° for 0≤V$_{bg}$≤20 V, and finally nearly inverted to ~170° for V$_{bg}$>40 V. These phase shifts are better illustrated by the raw oscillatory signals observed and collected with an oscilloscope as shown in FIGS. 5c-5e. When a negative V$_{bg}$ was applied to the back gate, $I_{ds}$ increased or decreased asynchronously with V$_{in}$, and consequently the corresponding V$_{out}$ also oscillated but in this case synchronously with V$_{in}$. This configuration corresponds to the so-called common drain mode and is illustrated by FIG. 5c. In contrast, when a positive V$_{bg}$ was applied, the corresponding V$_{out}$ also oscillated although asynchronously, that is with a phase difference of nearly 180° with respect to V$_{in}$, as shown in FIG. 5e (i.e. common-source mode). Remarkably, a phase shift of ~$\pi$/2 for V$_{bg}$=0 V was observed, which was attributed to the very high impedance of the FET for gate voltages inferior to the respective threshold gate voltages for conduction. The lack of a sizeable conductivity, or of a real component in the FET impedance, implies that its impedance is dominated by an imaginary component associated with, for example, the gate capacitance or capacitive and/or inductive couplings at the level of the contacts. Since the frequency is the rate of change of the phase, phase modulators can be used for Frequency Modulation ("FM"), and in fact they are employed in commercial FM transmitters. In addition to a phase shift modulator, the ambipolarity of ReSe$_2$ can also be useful for the development of static voltage inverters, for example, by combining a ReSe$_2$-based FET gated to display p-type behavior with another one gated to behave as n-type. In FIG. 11, the phase-shift was included as a function of the gate voltage for a second sample having approximately 10 layers. Hence, this behavior is reproducible among samples having a different number of layers.

In conclusion, given that the only symmetry operation present in the monolayer, few-layer and bulk ReSe$_2$ was inversion symmetry, the Raman study coupled to density functional theory calculations indicated that their Raman spectra contained only modes belonging to the A$_g$ irreducible representation. In addition and also in contrast to previous studies on the isostructural ReS$_2$ compound, which was found to behave as an electron doped material, ReSe$_2$ displayed ambipolar behavior when contacted with Cr:Au electrodes. Relative to ReS$_2$, a considerably larger variability was observed in the response of FETs fabricated from few layers of ReSe$_2$ mechanically exfoliated onto SiO$_2$. FETs based on ~10 layers of ReSe$_2$ were observed to display up to one order of magnitude larger room temperature electron mobilities relative to FETs based on thinner flakes or on ReS$_2$, with, remarkably, negligible threshold gate voltage for carrier conduction. This suggests that the material was intrinsically of high quality, or prone to a relative low density of defects. Given that Raman scattering as a function of time indicated that ReSe$_2$ was rather stable under ambient conditions, the relatively poor performance observed in FETs fabricated from samples composed of just 3 to 4 layers was attributable to a poorer quality of the electrical contacts and to a more prominent role for impurity scattering from interfacial charges and adsorbates on the top layer. For instance, the exposure of the contact area to electron irradiation during the fabrication process is known to locally damage the material, for example, by inducing Se vacancies on the surface of the material. But as discussed in a document entitled "Role Of Defects In Enhanced Fermi Level Pinning At Interfaces Between Metals And Transition Metal Dichalcogenides" written by Huang et al., Se vacancies can induce a large amount of interfacial states within the band gap leading, according to the DFT calculations, to nearly complete Fermi level pinning and possibly to larger Schottky barriers. Radiation induced defects should be particularly detrimental to monolayers, with their role weakening as the surface to volume ratio decreases or as the sample thickness increases. This would contribute to explaining the superior performance observed by us on FETs based on 8-10 layers when compared to those composed of 3-4 layers. It would also contribute to explain the relatively low mobilities previously reported by other groups for this compound.

Although the present results point to considerably higher mobilities for the samples composed of n=10 layers, one should take this observation with a grain of salt. For example, through a combination of measurements and simulations Das and Appenzeller concluded that four-terminal measurements would not be able to extract the intrinsic mobility of layered transition metal dichalcogenides given that both carrier concentration and mobility become spatially dependent. In addition, one could also argue that we have not etched our crystals in a Hall bar geometry hence the metallic contacts deposited on the channel could affect its properties yielding incorrect values for its intrinsic mobility. However, we obtain comparable values for the 2- and the 4-terminal mobilities extracted for the n=4 samples as well as similar values for the 2- and 4-terminal mobilities for the n=10 samples below T~100K. These observations, and their reproducibility in multiple samples with different geometries, strongly suggest that the higher mobilities for the n=10 samples are intrinsic and do not a result from an artifact associated with the geometry or the position of the contacts.

The ambipolarity of $ReSe_2$, when contrasted to the electron-doped behavior of $ReS_2$, bears resemblance with the 2H-phase compounds $MoSe_2$ and $MoS_2$, where the former was reported by us as being ambipolar while the second is well-known for behaving as electron doped. In TMDs, the nature of the carrier conduction, i.e. electron- or hole-like, is usually attributed to Fermi level pinning associated with the Schottky barriers around the metallic contacts. However, it seems difficult to reconcile this scenario with the differences in crystallographic and electronic structures between all of these compounds. Instead, it suggests that the electron character of $MoS_2$ and $ReS_2$ is intrinsically associated with the density of sulphur vacancies. In any case, as we showed here, the ambipolarity of TMDs like $ReSe_2$, allows one to produce quite simple logic elements having, for example, the ability to tune the phase of an incoming oscillatory signal towards 90° or 180° with the application of a single input voltage or the ability to invert a DC signal via two field-effect transistors having different geometries which are connected in series while sharing a single gate. It is therefore clear that these compounds have a remarkable potential for flexible logic applications. The current challenge is to understand and control the parameters limiting their performance, such as material quality, passivation, and Schottky barriers, in order to engineer commercial applications based on transition metal dichalcogenides.

Materials and Methods

Crystal Synthesis. $ReSe_2$ single crystals were synthesized through a Chemical Vapor Transport ("CVT") technique using either iodine or excess Se as the transport agent. Multi-layered flakes of $ReSe_2$ were exfoliated from these single crystals using the micromechanical cleavage technique and transferred onto p-doped Si wafers covered with a 285 nm thick layer of $SiO_2$.

Characterization. Atomic Force Microscopy ("AFM") imaging was performed using the Asylum Research MFP-3D* AFMt. Raman spectra were acquired under ambient conditions using a micro-Raman spectrometer (Renishaw inVia micro-Raman†). A grating of 1800 lines/mm was used in the backscattering geometry, and a 100× objective lens was used to focus a laser spot size of ~1 μm onto the sample. The laser wavelength used to excite the samples was 514.5 nm (2.41 eV) from an Ar—Kr laser with a power around 0.1 mW to avoid any possible damage to the sample. Each Raman spectrum was measured with a 10 second accumulation time. Energy dispersive spectroscopy, to verify the stoichiometry, was performed through field-emission scanning electron microscopy (Zeiss 1540 XB).

Transmission Electron Microscopy. Sub-Angstrom aberration corrected transmission electron microscopy was performed with a JEM-ARM200cF microscope.

Device fabrication. $ReSe_2$ crystals were mechanically exfoliated and then transferred onto a clean 285 nm thick $SiO_2$ layer. For making the electrical contacts 50 nm of Au was deposited onto a 5 nm layer of Cr via e-beam evaporation. Contacts were patterned using standard e-beam lithography techniques. After gold deposition, a PMMA lift off in acetone was performed. The devices were annealed at 300° C. for ~3 h in forming gas, followed by high vacuum annealing for 24 hours at 130° C. Immediately after vacuum annealing, the devices were coated with a ~20 nm thick Cytop™ (amorphous fluoropolymer)† layer to prevent air exposure. Electrical characterization was performed by using a combination of a dual channel sourcemeters, Keithley 2400, 2612A and 2635 coupled to a Quantum Design Physical Property Measurement System.

Figure 12:
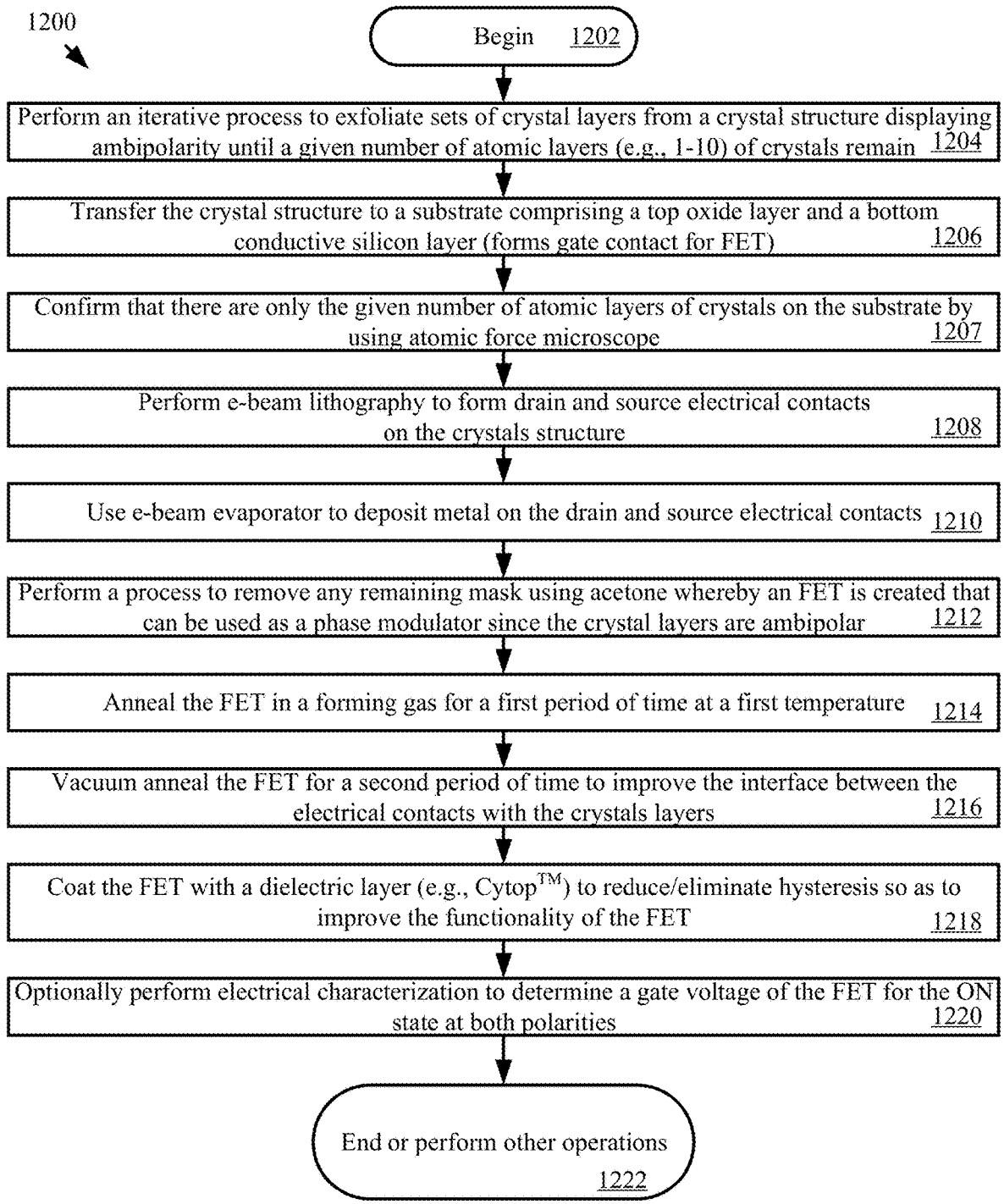
FIG. 12 is a flow diagram of an illustrative method for fabricating a phase modulator in accordance with the present solution.

Referring now to FIG. 12, there is provided a flow diagram of an illustrative method 1200 for fabricating a phase modulator in accordance with the present solution. In some scenarios, the phase modulator comprises an FET utilizing layered, two-dimensional materials consisting of a single- to a few-atomic layers. Method 1200 begins with 1202 and continues with 1204 where an iterative process is performed for mechanically exfoliating sets of crystal layers from a crystal structure until a given number of atomic layers of crystals remain. In some scenarios, tape is used to peel away layers of crystals from the crystal structure. The crystal structure includes any crystals which display ambipolarity and/or have an anisotropic crystalline structure. Such crystals include, but are not limited to, $ReSe_2$, $MoSe_2$, black phosphorous, and alpha-$MoTe_2$. The number of remaining atomic layers is selected in accordance with a particular application. In this regard, the number of remaining atomic layers is selected for flexibility and transparency reasons. In some scenarios, the number of remaining atomic layers is between 1-10. The present solution is not limited to the particulars of this scenario.

Figure 13A:
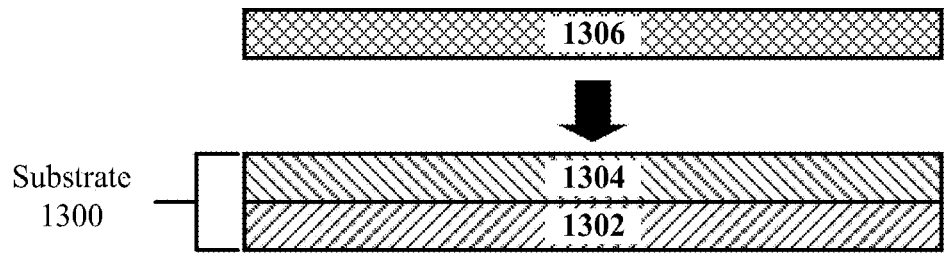
FIGS. 13A-13D (collectively referred to as "FIG. 13") provide illustrations that are useful for understanding a phase modulator fabricated in accordance with the present solution.

Next in 1206, the crystal structure is transferred to a substrate. In some scenarios, the substrate comprises a top oxide layer and a bottom conductive silicon layer. The conductive silicon layer will provide the gate contact for the fabricated FET. An illustration showing this transfer is provided in FIG. 13A. As shown in FIG. 13A, crystal structure 1306 is placed on substrate 1300, which comprises a top oxide layer 1304 and a bottom conductive silicon layer 1302. Gating of the present solution is not limited to the particulars of this scenario.

Figure 13B:
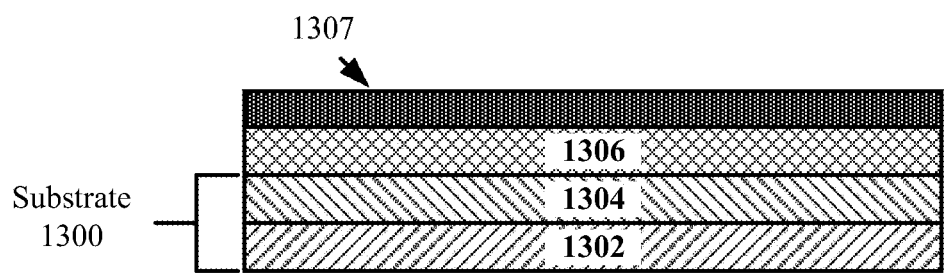
Figure 13C:
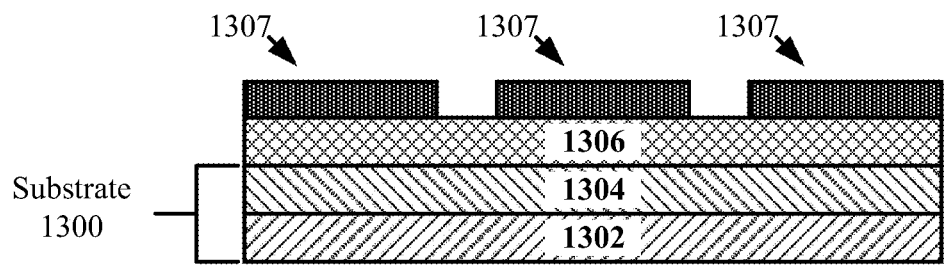

Referring again to FIG. 12, method 1200 continues with 1207 where an atomic force microscope is used to confirm that there are only the given number of atomic layers of crystals on the substrate. If so, then 1208 is performed. In 1208, e-beam lithography is performed to form drain and source electrical contacts on the crystal layers. E-beam lithography is well known in the art, and therefore will not be described in detail herein. Still, it should be understood that the E-beam lithography involves: coating the crystal structure with a layer of photoresist. An illustration showing the crystal structure 1306 coated with a photoresist layer 1307 is provided in FIG. 13B. Next, E-beam writing defines where the contacts will lie, and a chemical developer removes the part of the photoresist exposed to the electron beam. The reaming portion of the photoresist layer forms a mask which protects the rest of the device from a subsequent metal deposition step. An illustration showing portions of the photoresist layer removed is provided in FIG. 3C.

Figure 13D:
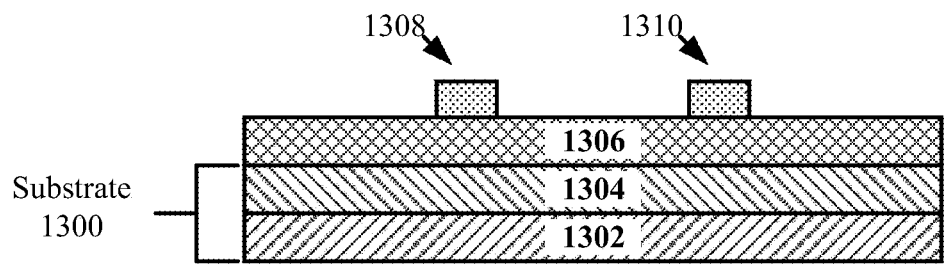

Subsequent to completing 1208, an e-beam evaporator is used to deposit metal on the stacked structure where the photoresist was removed in 1207. E-beam evaporators are well known in the art, and therefore will not be described herein. In 1212, any remaining mask is removed by successively using acetone, isopropanol, water and dry $N_2$ gas. The remaining metal defines the source and drain contacts. An illustration showing the drain contact 1308 and source contact 1310 is provided in FIG. 13D. At this point in the process, an FET is created that can be used as a phase modulator since the crystal layers display ambipolarity and/or have an anisotropic crystalline structure.

The FET is then annealed in a forming gas for a first period of time (e.g., 3 hours) at a first temperature (e.g., 300° C.), as shown by 1214. In 1216, the FET is vacuum annealed for a second period of time (e.g., 24 hours) at a second temperature (e.g., 130° C.). The annealing of 1214 and 1216 is performed to improve the interface between the electrical contacts with the crystal layers. After the annealing, the FET is coated with a dielectric material (e.g., Cytop™) to reduce and/or eliminate hysteresis so as to improve the functionality of the FET, as shown by 1218.

The FET can be optionally tested in 1220. For example, electrical characterization can be performed to determine a gate voltage of the FET for the ON state at both polarities. Techniques for electrical characterization are well known in the art, and therefore will not be described herein. Subsequently, 1222 is performed where method 1200 ends or other operations are performed (e.g., return to 1202).

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described embodiments. Rather, the scope of the present solution should be defined in accordance with the following claims and their equivalents.

What is claimed is:

1. A method for providing a phase modulator, comprising:
    creating a Field Effect Transistor ("FET") by
        placing a crystal structure displaying ambipolarity on a substrate comprising an oxide layer and a conductive silicon layer, the conductive silicon layer providing a gating electrical contact for the phase modulator, and
        forming source and drain electrical contacts on the crystal structure using e-beam lithography and an e-beam evaporator;
    annealing the FET to improve an interface between the crystal structure and the source and drain electrical contacts; and
    coating the FET with a dielectric layer to reduce or eliminate hysteresis so that a functionality of the phase modulator is improved.

2. The method according to claim 1, wherein the crystal structure comprises at least one of $ReSe_2$, $MoSe_2$, black phosphorous, and alpha-$MoTe_2$.

3. The method according to claim 1, wherein the conductive silicon layer provides a gate contact for the phase modulator.

4. The method according to claim 1, wherein the dielectric layer comprises amorphous fluoropolymer.

5. The method according to claim 1, further comprising performing electrical characterization to determine a gate voltage of the FET for an ON state at both polarities.

6. The method according to claim 1, wherein the annealing comprises:
    annealing the FET in a forming gas for a first period of time at a first temperature; and
    vacuum annealing the FET for a second period of time different from the first period of time.

7. The method according to claim 1, further comprising removing any remaining mask using acetone prior to said annealing.

8. The method according to claim 1, wherein the crystal structure comprises a number of crystal layers selected to provide the phase modulator with flexibility and transparency.

9. The method according to claim 8, wherein the number of crystal layers is between 1-10.

10. The method according to claim 1, further comprising performing an iterative process to exfoliate sets of crystal layers from the crystal structure until a given number of atomic layers of crystals remain.

11. The method according to claim 10, wherein a single- to few-atomic layers is proceeded via: a top-down process wherein a bulk crystal is grown followed by a wet or dry exfoliation; or a bottom-up process wherein crystal layers are synthesized on a substrate through a chemical vapor deposition process.

12. A Field Effect Transistor ("FET"), comprising:
    a substrate comprising an oxide layer and a conductive silicon layer, the conductive silicon layer providing a gating electrical contact for a phase modulator;
    a crystal structure placed on the substrate and displaying ambipolarity; and
    source and drain electrical contacts formed on the crystal structure using e-beam lithography and an e-beam evaporator;
    wherein the FET is annealed to improve an interface between the crystal structure and the source and drain electrical contacts, and coated with a dielectric layer to reduce or eliminate hysteresis so that a functionality of the phase modulator is improved.

13. The FET of claim 12, wherein the crystal structure comprises at least one of $ReSe_2$, $MoSe_2$, black phosphorous, and alpha-$MoTe_2$.

14. The FET according to claim 12, wherein the conductive silicon layer provides a gate contact for the phase modulator.

15. The FET according to claim 12, wherein the dielectric layer comprises amorphous fluoropolymer.

16. The FET according to claim 12, wherein a gate voltage of the FET for an ON state is determined at both polarities.

17. The FET according to claim 12, wherein the FET is annealed by:
   annealing the FET in a forming gas for a first period of time at a first temperature; and
   vacuum annealing the FET for a second period of time different from the first period of time.

18. The FET according to claim 12, wherein any remaining mask is removed using acetone prior to the FET being annealed.

19. The FET according to claim 12, wherein the crystal structure comprises a number of crystal layers selected to provide the phase modulator with flexibility and transparency.

20. The FET according to claim 19, wherein the number of crystal layers is between 1-10.

21. The FET according to claim 12, wherein sets of crystal layers are iteratively exfoliated from the crystal structure until a given number of atomic layers of crystals remain.

22. The FET according to claim 21, wherein a single- to few-atomic layers is proceeded via: a top-down process wherein a bulk crystal is grown followed by a wet or dry exfoliation; or a bottom-up process wherein crystal layers are synthesized on a substrate through a chemical vapor deposition process.

* * * * *